(12) United States Patent
Fu et al.

(10) Patent No.: US 8,995,597 B2
(45) Date of Patent: *Mar. 31, 2015

(54) DIGITAL SECOND-ORDER CDR CIRCUITS

(71) Applicant: Taiwan Semiconductor Manufacturing Company, Ltd., Hsin-Chu (TW)

(72) Inventors: Chin-Ming Fu, Zhubei (TW); Tsung-Hsin Yu, Hsin-Chu (TW); Chi-Chang Lu, Hsin-Chu (TW); Wei Chih Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

This patent is subject to a terminal disclaimer.

(21) Appl. No.: 13/679,123

(22) Filed: Nov. 16, 2012

(65) Prior Publication Data

US 2014/0140458 A1 May 22, 2014

Related U.S. Application Data

(63) Continuation of application No. 12/762,158, filed on Apr. 16, 2010, now Pat. No. 8,331,514.

(51) Int. Cl.
*H04L 7/00* (2006.01)
*H04L 7/033* (2006.01)

(52) U.S. Cl.
CPC ............ *H04L 7/0337* (2013.01); *H04L 7/0025* (2013.01)
USPC ........................................................ 375/371

(58) Field of Classification Search
USPC .................. 375/371, 373–376; 327/147–149, 327/155–158
See application file for complete search history.

(56) References Cited

U.S. PATENT DOCUMENTS

| | | | |
|---|---|---|---|
| 6,545,507 B1 | 4/2003 | Goller | |
| 7,315,596 B2 | 1/2008 | Payne et al. | |
| 7,571,360 B1 | 8/2009 | Lewicki et al. | |
| 7,991,086 B2* | 8/2011 | Koslov | 375/345 |
| 8,654,823 B1* | 2/2014 | Zhu et al. | 375/220 |
| 2005/0093595 A1 | 5/2005 | Rhee et al. | |
| 2006/0227914 A1 | 10/2006 | Partovi et al. | |
| 2007/0280392 A1 | 12/2007 | De Laurentiis et al. | |
| 2008/0112521 A1 | 5/2008 | Schmatz et al. | |
| 2009/0213911 A1* | 8/2009 | Bultan et al. | 375/149 |
| 2010/0098203 A1* | 4/2010 | Chien | 375/371 |

OTHER PUBLICATIONS

Bulzacchelli, J. F., et al., "A 10-Gb/s 5-Tap DFE/4-Tap FFE Transceiver in 90-nm CMOS Technology," IEEE Journal of Solid-State Circuits, vol. 41, No. 12, Dec. 2006, pp. 2885-2900.

(Continued)

*Primary Examiner* — Khanh C Tran
(74) *Attorney, Agent, or Firm* — Slater & Matsil, L.L.P.

(57) ABSTRACT

A method for performing a clock and data recovery includes providing data and a clock; determining early/late values of the data to generate a first-order phase code using the data and the clock; and accumulating first-order phase codes retrieved from different finite state machine (FSM) cycles to generate a second-order phase code. A plurality of candidate total phase codes is generated from the second-order phase code. A multiplexing is performed to the plurality of candidate total phase codes to output one of the plurality of candidate total phase codes as a total phase code. The multiplexing is controlled by the first-order phase code. A brake machine may be implemented to prevent over-compensation of phases.

27 Claims, 5 Drawing Sheets

(56) References Cited

OTHER PUBLICATIONS

Kromer, C., et al., "A 25-Gb/s CDR in 90-nm CMOS for High-Density Interconnects," IEEE Journal of Solid-State Circuits, vol. 41, No. 12, Dec. 2006, pp. 2921-2929.

Toifl, T., et al., "A 22-Gb/s PAM-4 Receiver in 90-nm CMOS SOI Technology," IEEE Journal of Solid-State Circuits, vol. 41, No. 4, Apr. 2006.

* cited by examiner

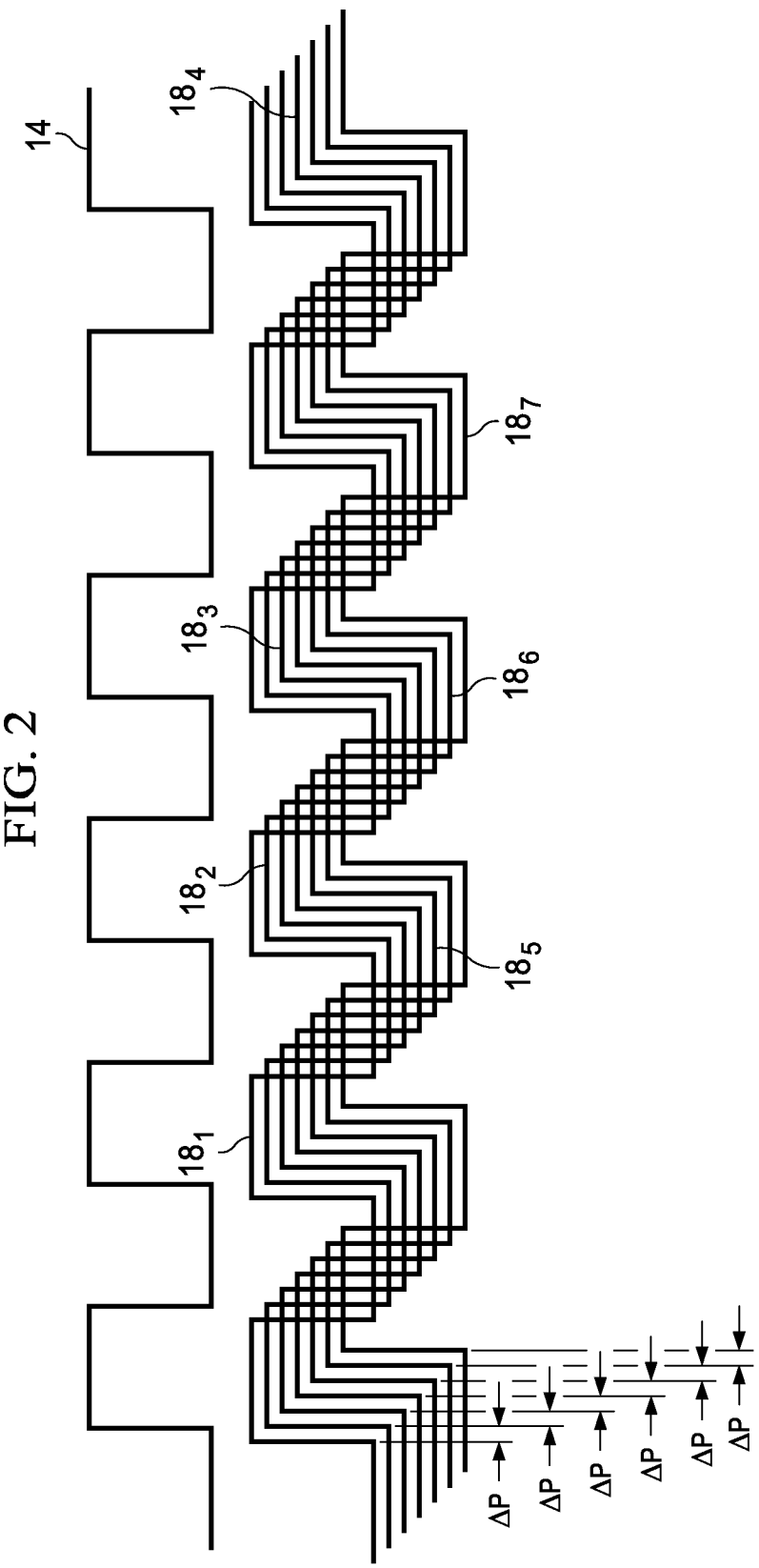

DIGITAL SECOND-ORDER CDR CIRCUITS

PRIORITY CLAIM AND CROSS-REFERENCE

This application is a continuation of U.S. patent application Ser. No. 12/762,158, entitled "Digital Second-Order CDR Circuits" filed on Apr. 16, 2010, which application is hereby incorporated herein by reference.

TECHNICAL FIELD

This disclosure relates generally to clock and data recovery (CDR) circuits, and more particularly to digital second-order CDR circuits with speculation ability, multi-gear implementation, or brake machines built therein.

BACKGROUND

There are several common serial communication standards currently available, including USB (Universal Serial Bus) 1.1 that provides communication speeds up to 12 Mbps (million bits per second), FireWire (IEEE 1394) that operates at 400 Mbps, and USB 2.0 that operates at a maximum of about 480 Mbps. The operational speeds of these standards have increased over time. For example, the speed of USB 2.0 is improved over that of USB 1.1 by over 40 times. State of the art optical networks used in data communications and telecommunications may operate at bit rates up to 40 Gbps (billion bits per second).

Generally, a serial communication network includes a transmitter and a receiver. The transmitter encodes or modulates a lower speed parallel data bus into a higher speed serial data stream that is then placed on a communication media. The serial data stream travels on the communication media and is then obtained from the communication media by the receiver. The serial data stream is then processed by the receiver in order to decode or recover the original data and de-serialize the resulting data into a duplicate parallel data bus.

All clock and data recovery (CDR) circuits attempt to recover the original transmitting clock despite these variations in reference frequencies or signal degradation due to jitters. A conventional CDR circuit (which is an analog circuit) attempts to recover the clock and data by utilizing a phase detector (PD) or alternatively a phase-frequency detector (PFD) to drive a charge pump followed by a loop filter and a voltage controlled oscillator (VCO) in a phase locked loop (PLL). The phase detector detects the absolute timing error between the current recovered clock and the timing of the ideal clock, and together with the charge pump, generates an error signal proportional to the size of the timing error. This error signal is filtered using a loop filter and used to drive the VCO. The conventional linear techniques use an analog PLL, which due to variations in the transition density in the incoming data and variations in the manufacturing process, have a bandwidth, tracking capability, and frequency acquisition range that is not tightly controlled.

Another type of CDR is a digital CDR based on phase interposers. A phase interpolator based clock recovery system recovers the clock by examining the sign of the phase error between the currently recovered clock and the data. If the recovered clock is too early, the clock recovery system delays the clock. If the recovered clock is too late, the clock is advanced. Accurately and quickly finding out the appropriate amount of delay or advancement is thus a key issue for the digital CDRs.

SUMMARY

In accordance with one aspect, a method for performing a clock and data recovery includes providing data and a clock; determining early/late values of the data to generate a first-order phase code using the data and the clock; and accumulating first-order phase codes retrieved from different finite state machine (FSM) cycles to generate a second-order phase code. A plurality of candidate total phase codes is generated from the second-order phase code. A multiplexing is performed to the plurality of candidate total phase codes to output one of the plurality of candidate total phase codes as a total phase code. The multiplexing is controlled by the first-order phase code. A brake machine may be implemented to prevent over-compensation of phases.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIG. 2 illustrates an initial clock and candidate clock signals that may be generated by rotating the initial clock;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel digital second-order clock and data recovery (CDR) circuit in accordance with an embodiment is presented. The variations and the operation of the embodiment are discussed. Throughout the various views and illustrative embodiments, like reference numbers are used to designate like elements.

Figure 1:
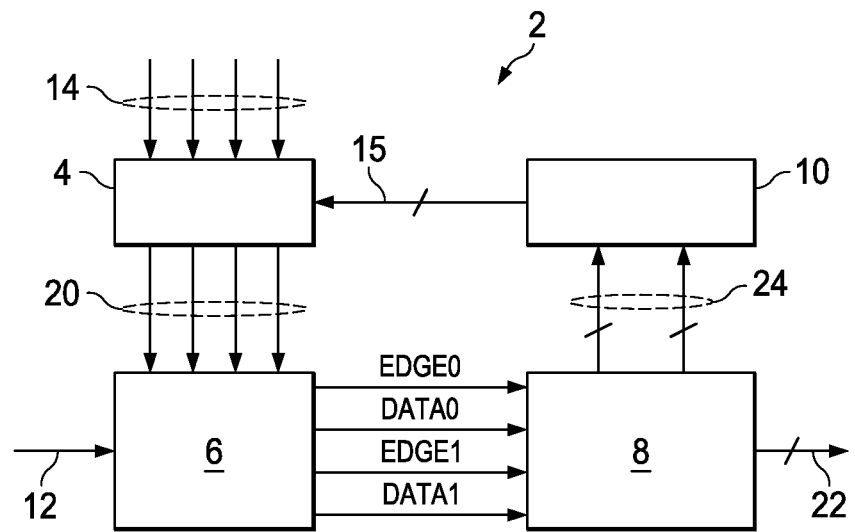
FIG. 1 illustrates a block diagram of a second-order digital clock and data recovery (CDR) circuit in accordance with an embodiment.

FIG. 1 illustrates a block diagram of a second-order CDR 2, which includes phase interposer 4, sense amplifier flip flop (SAFF) 6, demultiplexer 8, and finite state machine (FSM) 10. Second-order CDR 2 has the function of recovering clock and data signals based on input data 12 and initial clock 14. Initial clock 14 may include two clock edges CK0 and CK180

(not shown), wherein the digits following letters "CK" represent phases. Alternatively, initial clock 14 may include four clock edges CK0, CK90, CK180, and CK270 (not shown).

Phase interposer 4, based on initial clock 14 and phase code 15 received from FSM 10, generates rotated clocks by rotating (shifting) a phase from initial clock 14. FIG. 2 schematically illustrates initial clock 14 and a plurality of candidate rotated clocks 18. In an embodiment, candidate rotated clocks 18 have equal phase differences Δp, although the phase differences may also be different. Phase difference Δp is predetermined, and may be, for example, five degrees, 10 degrees, 15 degrees, or the like. Throughout the description, if a first clock signal is rotated from a second clock signal by phase difference Δp, 2Δp, 3Δp, or the like, the first clock signal is referred to as being rotated from the second clock signal by one step, two steps, three steps, or the like. Further, if the first clock signal is to be rotated to the right (later in time) than the second clock signal, the rotation steps are positive, for example, +1, +2, +3, and the like, and the corresponding phase codes 15 are also +1, +2, +3, and the like. Conversely, if the first clock signal is rotated to the left (earlier in time) than the second clock signal, the rotation steps are negative, for example, −1, −2, −3, or the like, and the corresponding phase codes 15 are also −1, −2, −3, and the like. It is realized that this definition can also be reversed. The rotated phase may be linearly correlated to phase code 15.

Referring back to FIG. 1, the rotated clock signal 20 outputted from phase interposer 4 is selected from the candidate rotated clocks 18 as shown in FIG. 2 according to phase code 15. In other words, phase interposer 4 generates one of the candidate rotated clocks 18 as outputted clock 20 based on a phase code 15 that is generated by FSM 10. For example, if phase code is −1 and +1, respectively, then rotated clock signal 20 will be generated by rotating initial clock 14 to the left by one step and to the right by one step, respectively, which means that clocks $18_1$ and $18_3$ (FIG. 2), respectively, will be generated. It is realized that the newly generated clock 20 will be used as the initial clock 14 for the next rotation. If phase codes 15 are −3, −2, +2, +3, or the like, the phases of the newly generated clocks may be shifted from the initial clock 14 more than one step each time, depending on the values of phase code 15.

SAFF 6 uses clock 20 and input data 12 to generate edges and data, for example, edge0, data0, edge1, and data1, as shown in FIG. 1. The edges and data generated by SAFF 6 are provided to demultiplexer 8 to generate output data 22 for further digital protocol processing. Data-and-edges 24 are also generated by demultiplexer 8 and provided to FSM 10. In an embodiment, FSM 10 has a lower processing rate than the frequency of input data 12. Accordingly, data-and-edges 24 are parallel signals converted from the serial signal 12. For example, demultiplexer 8 may convert every 8 bits of data and edges into one group of parallel data-and-edges 24. FSM 10 then processes data-and-edges 24 to generate phase code 15. Throughout the description, the duration that FSM 10 receives one group of data-and-edges 24 and sends the respective phase code 15 to phase interposer 4 is referred to as one FSM cycle, and the first-order phase code, the second-order phase code, and phase code 15 generated in the respective finite state machine cycle are referred to as "of" (or "for") the respective FSM cycle. Further, to distinguish different types of phase codes, phase code 15 is referred to as total phase code 15.

Figure 3A:
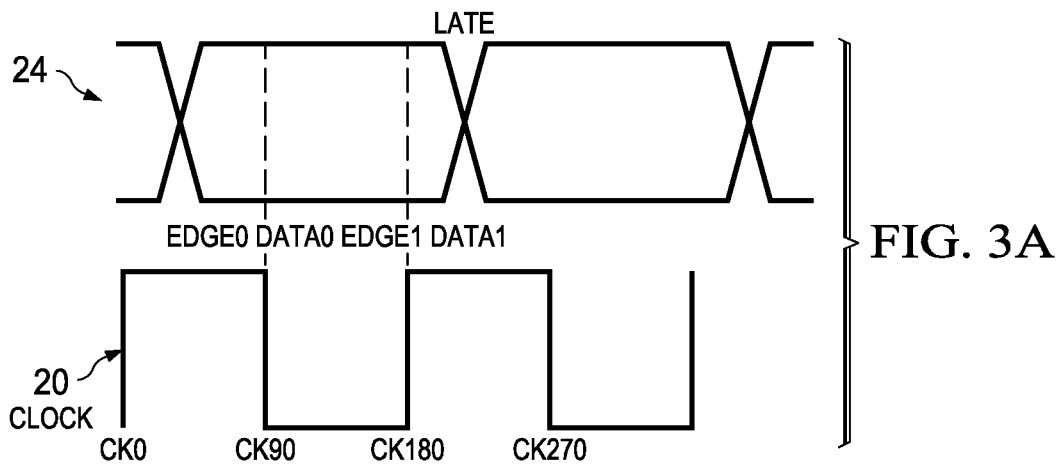
FIGS. 3A, 3B, and 3C are scenarios of the timing between data and a clock.
Figure 3B:
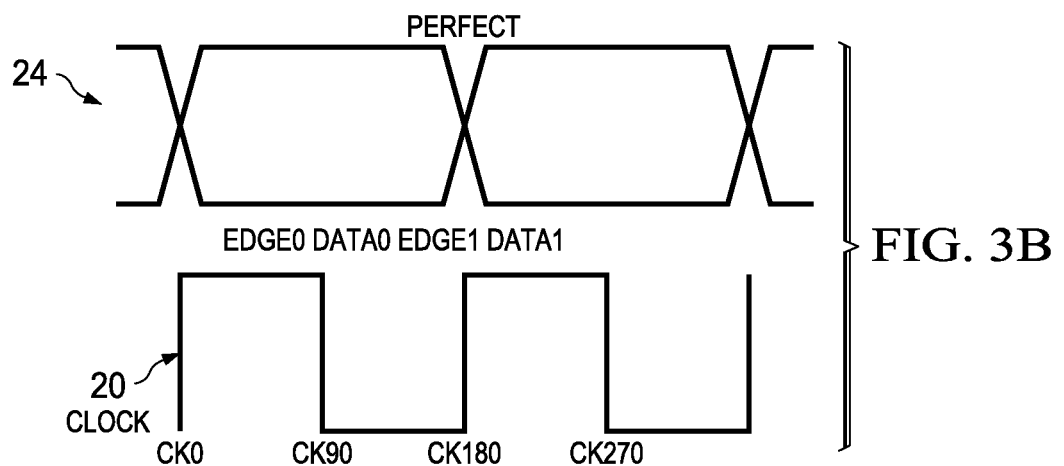
Figure 3C:
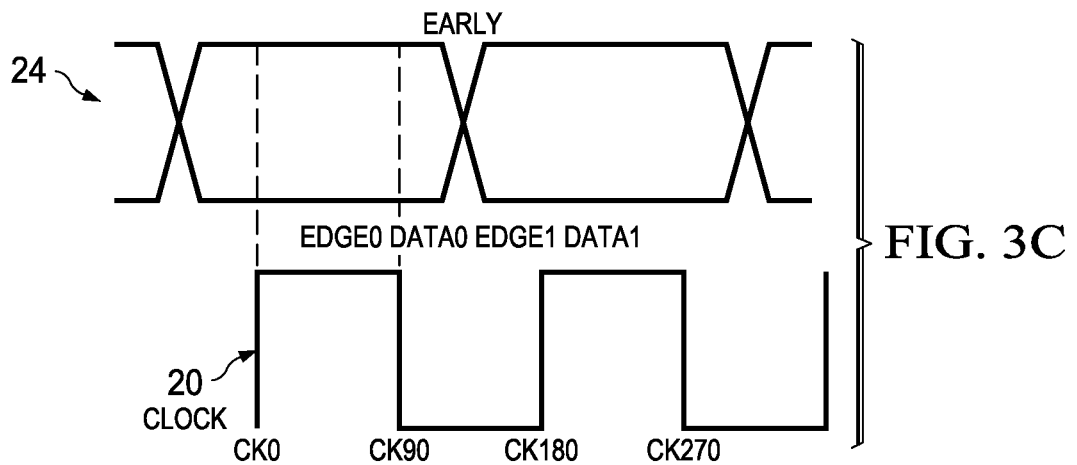

For FSM 10 to find out total phase code 15, whether each of the bits in data-and-edges 24 is earlier or later than clock 20 needs to be determined. An exemplary early/late determination process (which may be performed by early/late determination circuit 30 in FIG. 4) may be discussed referring to FIGS. 3A, 3B, and 3C, which illustrate three possible scenarios. The top portions of FIGS. 3A through 3C illustrate data-and-edges 24 (please also refer to FIG. 1), while the bottom portions of FIGS. 3A through 3C illustrate clock edges of clock 20. Referring to FIG. 3A, if clock edges CK90 and CK180 correspond to the same data ("1" in the example in FIG. 3A), then the respective bit of data-and-edges 24 is later than clock 20, and the respective early/late value is 1. Otherwise, referring to the FIG. 3C, if clock edges CK0 and CK90 correspond to the same data ("1" in the example in FIG. 3C), then the respective bit of data-and-edges 24 is earlier than clock 20, and the respective early/late value is −1. FIG. 3B illustrates a "perfect" scenario wherein a bit(s) of data-and-edges 24 is neither earlier nor later than clock 20, and the respective early/late value is 0.

Figure 4:
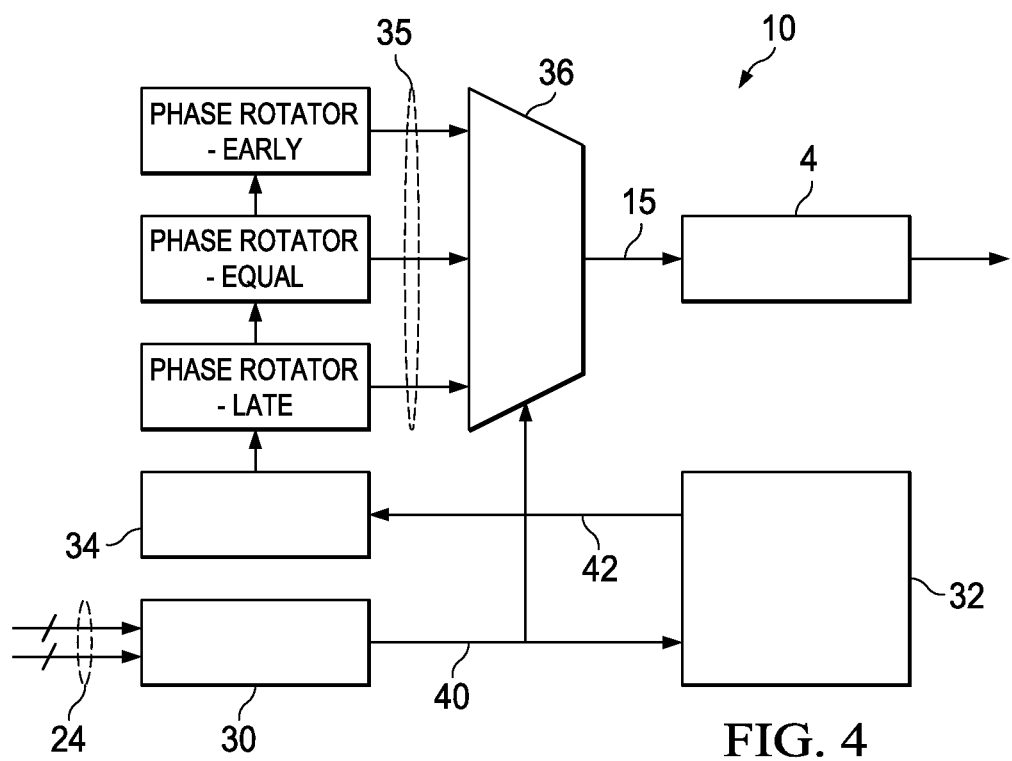
FIG. 4 illustrates a block diagram of a CDR with the speculation ability.

FIG. 4 illustrates a block diagram of FSM 10, which includes early/late determination circuit 30, second-order accumulator 32, step generator 34, and multiplexer 36. Early/late determination circuit 30 determines the early/late values of the bits in input data-and-edges 24, and calculates first-order phase code 40.

It is observed that for each bit of data-and-edges 24, one early/late value is generated. Since for each cycle of FSM 10, one group of data-and-edges 24, which include multiple bits, is processed, multiple early/late values are generated, each for one bit of data-and-edges 24. In an embodiment, the first-order phase code 40 (for the existing FSM cycle) is determined by adding all early/late values of all bits of data-and-edges 24. The sum of all early/late values is then converted to first-order phase code 40 that has the value of 1, 0, or −1. In an embodiment, a certain threshold value is used for the conversion. For example, if the sum is equal or greater than 4, then the respective first-order phase code 40 is 1. If the sum is equal to or less than −4, then the respective first-order phase code 40 is −1. Otherwise, if the sum is between and including −3 and 3, then the respective first-order phase code 40 is 0. In alternative embodiments, an "only all decision" approach is taken, in which first-order phase code 40 is 1 only if all early/late values of all bits are 1, and first-order phase code 40 is −1 only if all early/late values of all bits are −1. In all other scenarios, first-order phase code 40 is 0. By using this approach, the determination of first-order phase code 40 takes less time, and the loop latency, which is the time from data entering into CDR 2 (FIG. 1) to the time clock signal 20 is outputted by phase interposer 4, may be reduced.

Figure 5A:
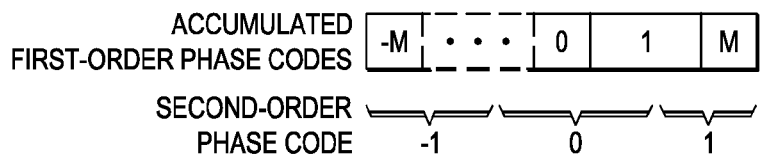
FIGS. 5A and 5B illustrate how accumulated values in a second-order accumulator convert to second-order phase codes.

Referring again to FIG. 4, second-order accumulator 32 receives and accumulates first-order phase code 40 obtained from all previous FSM cycles, and generates second-order phase code 42. Please note that second-order accumulator 32 keeps on accumulating without returning (emptying) the accumulated value to zero. For example, FIG. 5A illustrates a diagram for determining second-order phase code 42. To accumulate first-order phase code, one or more registers (not shown) may be used to record the accumulated first-order phase code, and the value recorded in the register is added with the newly generated first-order phase code 40 to generate a new accumulate first-order phase codes. Therefore, for each FSM cycle, the accumulated value may be increased by 1, kept unchanged, or reduced by 1, until the register reaches the minimum value −M or the maximum value M. The accumulated first-order phase code 40 may then be converted to the second-order phase code 42. If second-order phase code 42 has possible values of −1, 0, and 1, then the accumulated first-order phase code is divided into three sub ranges, and the resulting second-order phase code 42 will be determined by which sub range the accumulated first-order phase code fall into, as shown in FIG. 5A.

Alternatively, if second-order phase code 42 is designed to range from −2 to +2, then the values of the accumulated first-order phase codes may be divided into five sub ranges corresponding to −2, −1, 0, +1, and +2. The accumulated first-order phase codes will not be returned to zero (emptied), and will keep on accumulating with time, although the maximum value M and minimum value −M are limited by the capacity of the registers. Such continued accumulation results in the second-order compensation for the phases to have the effect of frequency-compensation, which compensates for the frequency difference between data and clock.

Referring again to FIG. 4, it is realized when second-order phase code 42 is determined, since the first-order phase code may only have three possible values −1, 0, and +1, total phase code 15, which is the sum of first-order phase code 40 and second-order phase code 42, only has three possible (candidate) values, that are, second-order phase code 42 reduced by 1, second-order phase code 42 itself, and second-order phase code 42 added by 1. Step generator 34 thus generates the three candidate phase codes 35, and provides the candidate phase codes 35 (denoted as "phase rotator—early," "phase rotator—equal," and "phase rotator—late") to three inputs of multiplexer 36. The output of multiplexer 36 then uses first-order phase code 40 to multiplex the three candidate phase codes 35, and outputs total phase code 15 (which is also shown in FIG. 1).

It is realized that first-order phase code 40 is a fast-changing code that may possibly (but not necessarily) change for each of the FSM cycles. However, second-order phase code 42 is a slow-changing code that may take multiple FSM cycles to change. For example, referring to FIG. 5A, the second-order phase code is changed only if the accumulated first-order phase codes entering from one sub range to another. Accordingly, assuming FSM cycle C1 (not shown) is followed by FSM cycle C2 (not shown), then during or after FSM cycle C1, a second-order phase code 42 for FSM cycle C1 may be generated, and may be combined with the first-order phase code 40 for FSM cycle C2 to generate three candidate phase codes 35 for multiplexer 36 for FSM cycle C2, without the need to wait for the second-order phase code 42 for FSM cycle C2 to be generated. This is referred to as speculation since it is expected that the second-order phase code 42 for FSM cycle C2 will very likely be the same as the second-order phase code 42 for FSM cycle C1. Although exceptions occur when the accumulated first-order phase codes cross the boundaries of sub ranges (FIG. 5A), the exceptions have little, if any, effect to the performance of CDR 2 (FIG. 1). In the above discussed steps, the step of generating and multiplexing phase codes 35 are performed in the FSM cycle C2, while the step of generating second-order phase code 42 may be performed in FSM cycle C1. This significantly reduces the loop latency.

Figure 6:
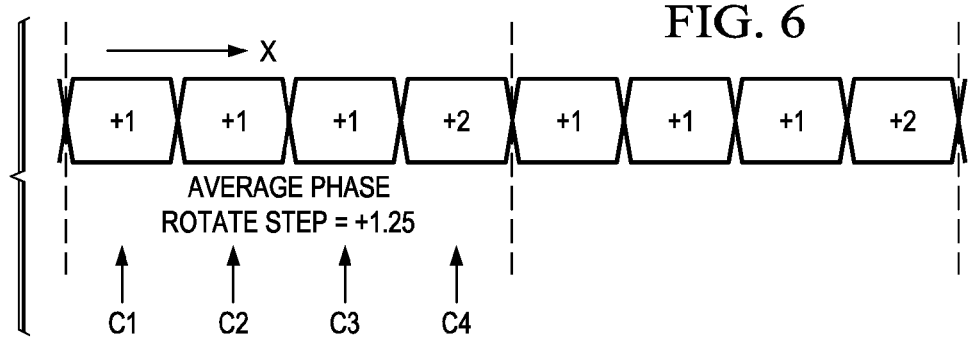
FIG. 6 illustrates the phase codes for implementing a multi-gear second-order CDR in accordance with an exemplary embodiment.

FIG. 6 illustrate a multi-gear implementation for implementing phase codes 15 (FIG. 1) that have non-integer values. Phase interposer 4 (FIG. 1) may only support the phase rotations by integer steps (FIG. 2), and hence only receives integer phase codes 15. This is due to the reason that the phase differences between candidate clock signals 18 (FIG. 2) are pre-set to be constant values. The scheme in FIG. 6, however, may implement non-integer phase codes. In FIG. 6, the X-axis represents time, while the values in blocks represent total phase code 15. A certain number of consecutive FSM cycles (for example, C1 through C4) may be grouped, so that the average phase code in a same group will be a non-integer value equal to the non-integer phase code 15. FIG. 6 includes two FSM cycle groups. In the example shown in FIG. 6, the average of phase codes 1, 1, 1, and 2 is 1.25. This means that in four consecutive FSM cycles, if the phase codes 15 sent to phase interposer 4 are 1, 1, 1, and 2, the effect is the same as sending a non-integer phase code of 1.25 in each of consecutive FSM cycles C1 through C4. Accordingly, assuming total phase code 15 ranges from −2 to +2, then through different combinations of, four consecutive FSM cycles may have equivalent phase codes −2, −1.75, −1.5, −1.25, −1. −0.75, −0.5, −0.25, 0, 0.25, 0.5, 0.75, 1, 1.25, 1.5, 1.75, and 2. Clearly, by increasing the number of consecutive FSM cycles in each group, smaller phase code differences can be implemented, which may help to improve jitter performance. Such implementation is referred to as a multi-gear implementation.

Figure 7:
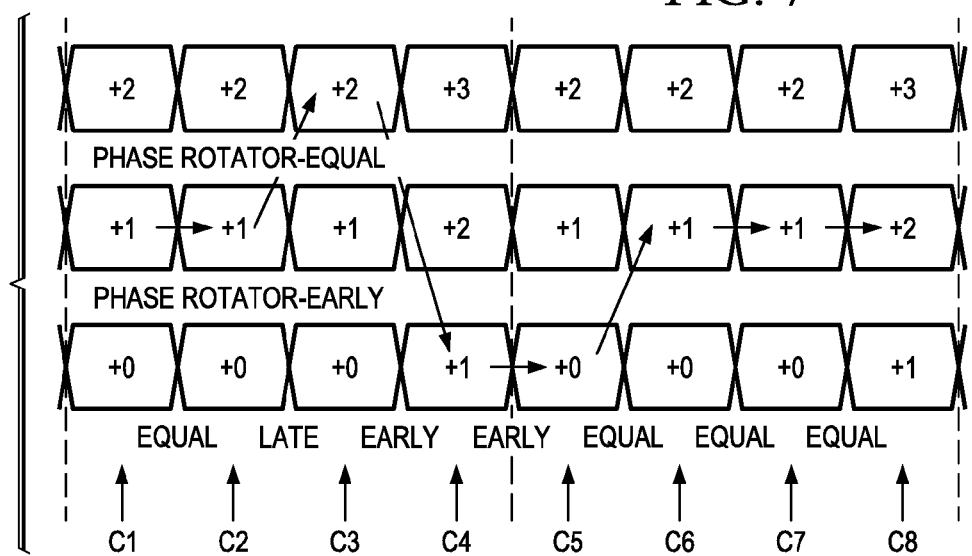
FIG. 7 illustrates the phase codes for implementing a multi-gear second-order CDR having the speculation ability in accordance with an exemplary embodiment.

The multi-gear implementation and the speculation of the second-order phase code may be combined to achieve both small loop latency and small jitter. FIG. 7 illustrates two FSM cycle groups, with the first row, the second row, and the third row representing the three candidate codes 35 (FIG. 4). The second row also represents second-order phase code 42. For the exemplary group including FSM cycles C1 through C4, second-order phase code 1.25 (the average of the phase codes in the middle row) is speculated, and is pre-determined (pre-calculated) before FSM cycle C1 starts. Therefore, the second-order phase codes of FSM cycles C1 through C4 will be set to 1, 1, 1, and 2, respectively, regardless what the calculated second-order phase codes are. Therefore, second-order accumulator 32 (FIG. 4) may be used to send out the second-order phase codes of FSM cycles C1 through C4 in each of the FSM cycles C1 through C4. Referring to FSM cycle C1 in FIG. 7, since the speculated second-order phase code is 1, the resulting total phase code 15 can only be 0, 1, or 2. The actual total phase code 15 output by multiplexer 36 is determined by the first-order phase code in FSM cycle C1. Assuming the first-order phase codes in FSM cycles C1, C2, C3, C4, C5, C6, C7, and C8 are 0, 0, 1, −1, −1, 0, 0, and 0, respectively, then the total phase codes 15 outputted by multiplexer 36 will be the values on the path of arrows.

Figure 5B:
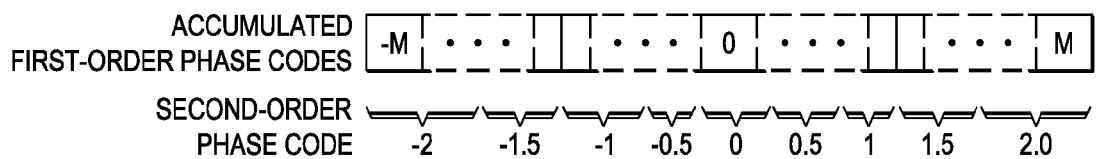

Referring back to FIG. 4, the non-integer phase code may be generated by second-order accumulator 34, which instead of converting the accumulated first-order phase code only into integers, will also convert the accumulated first-order phase codes into non-integers, such as −1.25, 1.25, or the like. This may be implemented by dividing the accumulated first-order phase codes into smaller sub ranges, with an example being shown in FIG. 5B. Step generator 34 (FIG. 4), however, will generate only integer candidate total phase codes 35, which are shown as the three rows in FIG. 7.

It is observed that first-order phase code 40 is directly used for correcting phase variations. Second-order phase code 42, on the other hand, has the effect of correcting frequency variations. For example, if a series of first-order phase codes are positive, it may be an indication that clock 20 (FIG. 1) has a higher frequency than the data. Accordingly, adding the second-order phase code onto the first first-order phase code is equivalent to adjusting the frequency of the clock.

In the embodiments, by using the speculation of second-order phase code 42, the loop latency is reduced. Accordingly, the likelihood of over-compensation of phases is reduced. Further, with the multi-gear implementation, the rotation of the phases of clocks is equivalent to having smaller steps, and hence the possible jitter caused by the over-rotating of the phases of the clock, if any, is also reduced.

Figures 8, 9A, 9B:
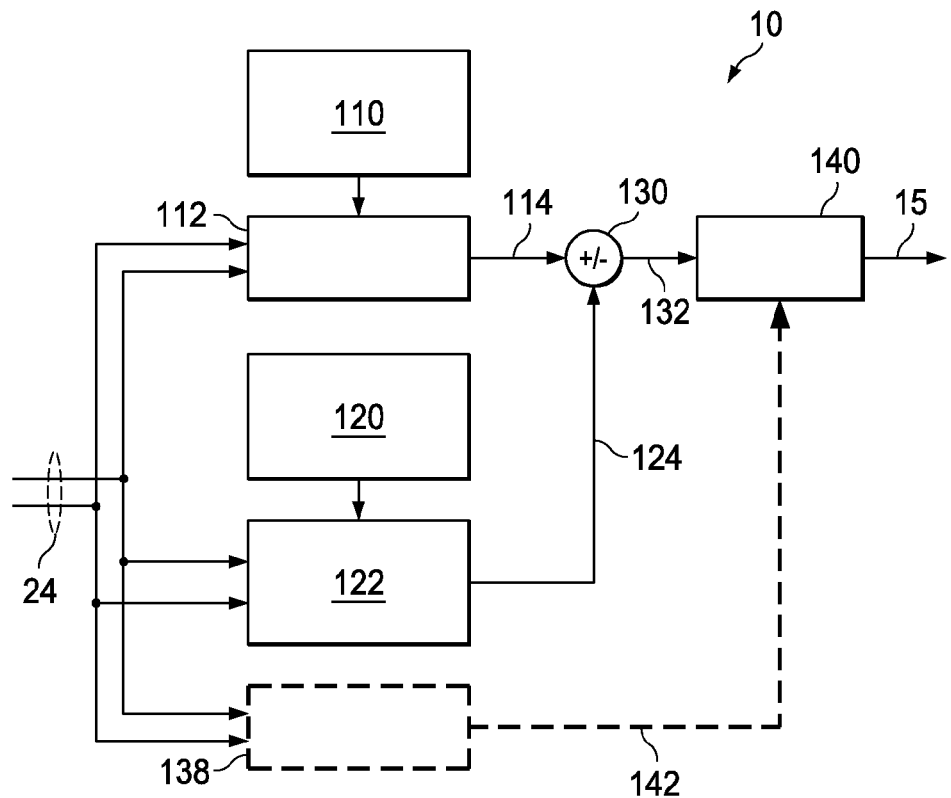
FIG. 8 illustrates the block diagram of a second-order CDR with a brake machine.
FIGS. 9A and 9B illustrate the outputted phase codes when a brake machine is added.

FIG. 8 illustrates a block diagram of a part of FSM 10 in accordance with an alternative embodiment, which includes a brake machine. The illustrated portion in FIG. 8 includes a first path for determining first-order phase code 114, and a second path for determining second-order phase code 124. The first path includes phase detect adder 112 for calculating the summation of the early/late values of all of the bits in data-and-edges 24 (please also refer to FIG. 1), which is received by FSM 10. For example, if data-and-edges 24 includes eight bits, and six of the eight bits are early (meaning the respective clock is earlier than the bits), then each of the six bits has an early/late value equal to 1. Further assuming one of the eight bits is late, and one of the eight bits is perfect, then the respective early/late values are −1 and 0, respectively. The sum of all of the early/late values will be 6−1+0=5. This sum is compared with the pre-determined phase gain coefficient 110. If the sum of all of the early/late values is equal to or greater than the phase gain coefficient (for example, with a value 4), then first-order phase code 114 is 1. Conversely, if the sum is equal to or less than the negative value of the phase gain coefficient (for example, with a value −4), then first-order phase code 114 is −1. If the sum is between the phase gain coefficient and the negative value of the phase gain coefficient, for example, between −4 and 4, then first-order phase code 114 is 0. The sum is returned to zero (the respective register is emptied) each time first-order phase code 114 is set to −1 or 1. Otherwise, the sum will be added to the sum of the early/late values of all bits received in the next FSM cycle. The first path has the function of compensating for phase variations.

The second path includes an early/late value accumulator 122 (which is also referred to as a frequency detect accumulator). Frequency detect accumulator 122 accumulates early/late values of all bits of data-and-edges 24 in all FSM cycles and is not returned to zero (emptied). The resulting second-order phase code 124 may have values −1, 0, or 1. Again, similar to what is shown in FIG. 5A, whether second-order phase code 124 is −1, 0, or 1 depends on which range the accumulated value is located in, except in this embodiment, early/late values, rather than first-order phase codes, are accumulated. The sub ranges of the accumulated value are divided using frequency gain coefficient 120, with the accumulated values greater than the frequency gain coefficient 120 being in a range, and the respective second-order phase code 124 being 1. The accumulated values less than the negative value of the frequency gain coefficient 120 may be in another range, and the respective second-order phase code 124 being −1. The remaining accumulated values may be considered to correspond to second-order phase code 124 being 0. Frequency gain coefficient 120 may be selected to optimize the reaction of the respective FSM 10. For example, a smaller value of frequency gain coefficient 120 results in a faster reaction.

It is observed that frequency gain coefficient 120 may be much greater than phase gain coefficient 110. For example, phase gain coefficient 110 may be 4, while frequency gain coefficient 120 may be 128. The respective CDR 2 (FIG. 1) thus responds to phase variations relatively quickly, while it responds to frequency variation relatively slowly.

First-order phase code 114 and second-order phase code 124 are then summed by summation circuit 130 to generate phase code 132, which is further processed to generate total phase code 15 that is provided to phase interposer 4 (FIG. 1). Since each of first-order phase code 114 and second-order phase code 124 only has three possible values, −1, 0, and 1, total phase code 15 only has five possible values, −2, −1, 0, 1, and 2, and hence phase interposer 4 will only rotate the phase of the clock by at most two steps in each rotation.

In an embodiment, brake machine 140 is provided to further process phase code 132. In an embodiment, brake machine 140 is provided. It is realized that second-order phase code 124 is a slow-changing code that may take multiple FSM cycles to change, and hence the resulting total phase code 15 may cause the over-compensation of phases. Brake machine 140 is thus used to prevent the over-compensation. In an embodiment, brake machine 140 receives a value from pre-detect circuit 138, which generates pre-detect phase code 142, and outputs total phase code 15 by comparing the signs of pre-detect phase code 142 and phase code 132.

Pre-detect circuit 138 sums the early/late values of the bits in data-and-edges 24 received in the current FSM cycle. Since pre-detect circuit 138 does not perform summation or accumulation for more than one FSM cycle, the response is faster than the response of first-order phase code 114 and second-order phase code 124. For example, in a first FSM cycle, the first-order phase code 114 is 1, the second-order phase code 124 is 1, and the phase code 132 (and total phase code 15) is 2. In a second FSM cycle immediately following the first FSM cycle, each of first-order phase code 114 and the second-order phase code 124 may still be 1 since the early/late transition of first-order phase code 114 and second-order phase code 124 may take more than one FSM cycle to occur. However, the transition of pre-detect phase code 142 occurs in only one FSM cycle and may become −1. Pre-detect phase code 142 thus may be used to tell whether an early/late transition has occurred. At this time, if the total phase code 15 in the preceding FSM cycle is either +2 or −2 and has a different sign from that of pre-detect phase code 142 in the existing FSM cycle, then it is determined that an over-compensation may occur, and brake machine 140 may change phase code 132 to a value having a smaller amplitude than the amplitude of phase code 132, and output the value as total phase code 15. For example, the braking may occur when phase code 132 is 2 and pre-detect phase code 142 is −1, or when phase code 132 is −2 and pre-detect phase code 142 is 1. Accordingly, brake machine 140 will output total phase code 15 that has a smaller amplitude (1 or 0), as shown in FIG. 9A. The symbol "x" represents any of the values "4," "0," and "1." This action is equivalent to applying a brake on the phase/frequency compensation. This provides a buffer time for first-order phase code 114 and second-order phase code 124 to steer to the correct directions so that the likelihood of over-compensation is reduced.

When brake machine 140 reacts, it may output the phase code with reduced amplitude (for example "0") for only one FSM cycle, or for two (as also shown in FIG. 9A), three, or more consecutive FSM cycles. After the braking, the state of FSM 10 is returned back to a normal operation, and total phase code 15 will be equal to phase code 132, until the next braking action occurs.

In an alternative embodiment, instead of using pre-detect phase code 142 (FIG. 8) to determine whether or not to brake, brake machine 140 will perform automatic braking. For example, brake machine 140 only allows the total phase code 15 to be +2 for a certain number (a pre-determined threshold number) of consecutive FSM cycles. In the FSM cycle immediately following the consecutive FSM cycles, if the calculated phase code 132 is still +2, brake machine 140 changes the outputted total phase code 15 to a value having a smaller amplitude, which may be 1 or 0. In an exemplary embodiment, as shown in FIG. 9B, brake machine 140 only allows total phase code 15 to be equal to "2" for two consecutive FSM cycles, and will change total phase code 15 to "1" or "0" if phase code 132 is still 2 in the next FSM cycle. In other words, brake machine 140 will not output total phase code 15 with the pattern "2, 2, 2," and will change it to "2, 2, 1" or "2, 2, 0." The similar brake action will also be performed if phase code 132 is equal to "−2" for a certain number of consecutive FSM cycles. In this case, however, brake machine 140 will output "−1" or "0" instead of "−2." Experiments have indicated that such a brake machine may reduce intrinsic jitter.

In the embodiments, by adopting a brake machine to prevent the over compensation, the jitter performance is improved since the phase difference between clock and data will return to perfect state (FIG. 3) more quickly.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A clock and data recovery circuit comprising:
a finite state machine (FSM) comprising:
an early/late determination circuit configured to output a first-order phase code; and
a second-order accumulator configured to receive and accumulate first-order phase codes of different FSM cycles, and to generate a second-order phase code, wherein the second-order phase code is a non-integer.

2. The clock and data recovery circuit of claim 1 further comprising:
a demultiplexer configured to convert serial signals to parallel signals, and output the parallel signals to the early/late determination circuit to generate the first-order phase code;
a step generator configured to generate a plurality of candidate total phase codes from the second-order phase code; and
a multiplexer configured to receive the plurality of candidate total phase codes, wherein the multiplexer is controlled by the first-order phase code to output one of the plurality of candidate total phase codes as a total phase code.

3. The clock and data recovery circuit of claim 2 further comprising a phase interposer coupled to the FSM and configured to rotate a phase from an initial clock to generate a rotated clock, wherein the phase is linearly correlated to the total phase code.

4. The clock and data recovery circuit of claim 2, wherein the second-order phase code is generated in a first FSM cycle, wherein the first-order phase code for controlling the multiplexer is generated in a second FSM cycle later in time than the first FSM cycle.

5. A method for performing a clock and data recovery, the method comprising:
providing a data and a clock; and
in a first finite state machine (FSM) cycle:
generating a first-order phase code using the data and the clock;
performing a first summation to the first-order phase code and a second-order phase code to generate a first total phase code;
changing the first total phase code to a second total phase code having a smaller amplitude than the first total phase code; and
outputting the second total phase code to a phase interposer.

6. The method of claim 5 further comprising:
performing a pre-determination to calculate a pre-detect phase code, wherein the step of performing the pre-determination does not use early/late values obtained from FSM cycles earlier in time than the first FSM cycle;
when the pre-detect phase code and the first total phase code have different signs, performing the step of changing the first total phase code to the second total phase code; and
when the pre-detect phase code and the first total phase code have a same sign, outputting the first total phase code to the phase interposer without performing the step of changing the first total phase code to the second total phase code.

7. The method of claim 6, wherein the first total phase code is 2 or −2, and the second total phase code is 0.

8. The method of claim 5 further comprising:
pre-selecting a threshold number;
determining a total number of consecutive FSM cycles before the first FSM cycle, wherein in each of the consecutive FSM cycles, the first total phase code is outputted to the phase interposer; and
performing the step of changing the first total phase code to the second total phase code only when the total number is greater than the threshold number, wherein the first total phase code is outputted to the phase interposer without being changed to the second total phase code when the total number is equal to or smaller than the threshold number.

9. The method of claim 8, wherein the first total phase code is 2 and the second total phase code is 1, or the first total phase code is −2, and the second total phase code is −1.

10. The method of claim 5, wherein the step of changing the first total phase code to the second total phase code is performed for only one FSM cycle, and wherein in a second FSM cycle immediately after the first FSM cycle, the step of changing the first total phase code to the second total phase code is not performed.

11. The method of claim 5, wherein the step of changing the first total phase code to the second total phase code is performed for two consecutive FSM cycles, and wherein in a second FSM cycle immediately after the two consecutive FSM cycles, the step of changing the first total phase code to the second total phase code is not performed.

12. The method of claim 5, wherein the step of changing the first total phase code to the second total phase code is performed for three consecutive FSM cycles, and wherein in a second FSM cycle immediately after the three consecutive FSM cycles, the step of changing the first total phase code to the second total phase code is not performed.

13. The method of claim 5 further comprising, using a phase interposer to rotate a phase from the clock to generate a rotated clock signal, wherein the phase is linearly correlated to the second total phase code.

14. A method for performing a clock and data recovery, the method comprising:
in a first finite state machine (FSM) cycle:
receiving a first data;
generating early/late values using the first data;

generating a first-order phase code by summing early/late values from different FSM cycles;

generating a second-order phase code by accumulating early/late values from additional different FSM cycles;

performing a first summation to the first-order phase code and the second-order phase code to generate a first total phase code;

changing the first total phase code to a second total phase code having a smaller amplitude than the first total phase code; and outputting the second total phase code to a phase interposer; and in a second FSM cycle:

receiving a second data;

generating additional early/late values using the second data;

generating an additional first-order phase code using the additional early/late values;

generating an additional second-order phase code using the additional early/late values;

performing a second summation to the additional first-order phase code and the additional second-order phase code to generate a third total phase code; and outputting the third total phase code to the phase interposer.

15. The method of claim 14 further comprising:

in the first FSM cycle, performing a first pre-determination to calculate a first pre-detect phase code using the first data, wherein the first pre-detect phase code and the first total phase code have different signs; and in the second FSM cycle, performing a second pre-determination to calculate a second pre-detect phase code using the second data, wherein the second pre-detect phase code and the third total phase code have a same sign.

16. The method of claim 15, wherein the first total phase code is 2 or −2, and the second total phase code is 0.

17. The method of claim 14 further comprising:

determining a total number of consecutive FSM cycles in which the first total phase code is outputted to the phase interposer;

when the total number is greater than a pre-determined number, performing the step of changing the first total phase code to the second total phase code and the step of outputting the second total phase code to the phase interposer; and when the total number is equal to or less than the pre-determined number, performing the step of performing the second summation and the step of outputting the third total phase code to the phase interposer.

18. The method of claim 17, wherein the first total phase code is 2 and the second total phase code is 1, or the first total phase code is −2, and the second total phase code is −1.

19. The method of claim 14 further comprising, after the first FSM cycle, using the phase interposer to rotate a phase from an initial clock to generate a rotated clock, wherein the phase is linearly correlated to the second total phase code.

20. A clock and data recovery circuit comprising:

a finite state machine (FSM) comprising:

a phase detect adder configured to generate a first-order phase code from an input data;

an frequency detect accumulator configured to generate a second-order phase code from the input data;

a summation circuit configured to add the first-order phase code and the second-order phase code to generate a first total phase code; and a brake machine configured to a change the first total phase code to a second total phase code having a smaller amplitude than the first total phase code; and a phase interposer coupled to the FSM, wherein the second total phase code is outputted to the phase interposer.

21. The clock and data recovery circuit of claim 20, wherein the phase detect adder is configured to:

calculate a summation of early/late values from bits of the input data;

convert the summation to the first-order phase code; and empty the summation from the summation circuit.

22. The clock and data recovery circuit of claim 20, wherein the frequency detect accumulator is configured to:

calculate a summation of early/late values from bits of input data for all previous FSM cycles; and convert the summation to the second-order phase code, wherein the frequency detect accumulator does not empty the summation.

23. The clock and data recovery circuit of claim 20 further comprising a pre-detect circuit configured to calculate a pre-detect phase code from the input data, wherein the brake machine is configured to perform the step of changing the first total phase code to the second total phase code when the first total phase code and the pre-detect phase code have different signs, and not to perform the step of changing the first total phase code to the second total phase code when the first total phase code and the pre-detect phase code have a same sign.

24. The clock and data recovery circuit of claim 23, wherein the first total phase code is 2 and the second total phase code is 1, or the first total phase code is −2, and the second total phase code is −1.

25. The clock and data recovery circuit of claim 20, wherein the brake machine is configured to:

calculate a total number of consecutive FSM cycles immediately before a FSM cycle, wherein in each of the consecutive FSM cycles, the first total phase code having a maximum phase code amplitude is outputted to the phase interposer;

perform the step of changing the first total phase code to the second total phase code when the total number is greater than a pre-determined number; and not to perform the step of changing the first total phase code to the second total phase code when the total number is equal to or less than the pre-determined number.

26. The clock and data recovery circuit of claim 25, wherein the total number is two.

27. The clock and data recovery circuit of claim 25, wherein the first total phase code is 2 or −2, and the second total phase code is 0.

* * * * *